Figure 1:
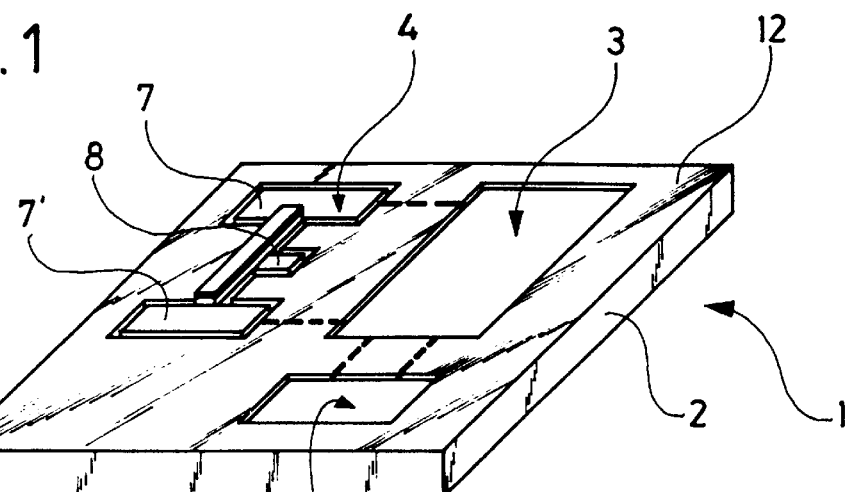

United States Patent
Hermann

[11] Patent Number: 5,856,765
[45] Date of Patent: Jan. 5, 1999

[54] ELECTRONIC DEVICE COMPRISING AN INTEGRATED TIME BASE

[75] Inventor: Jean Hermann, Neuchâtel, Switzerland

[73] Assignee: Centre Electronique Horloger S.A., Neuchatel, Switzerland

[21] Appl. No.: 815,721

[22] Filed: Mar. 12, 1997

[30] Foreign Application Priority Data

Mar. 15, 1996 [FR] France ................................. 96 03292

[51] Int. Cl.⁶ ...................................................... H03B 5/32
[52] U.S. Cl. ................. 331/108 C; 331/74; 331/116 FE; 331/176
[58] Field of Search ........................... 331/108 C, 108 D, 331/116 R, 116 FE, 74, 78, 176

[56] References Cited

U.S. PATENT DOCUMENTS

| | | | |
|---|---|---|---|
| 4,456,850 | 6/1984 | Inoue et al. | 310/324 |
| 4,640,756 | 2/1987 | Wang et al. | 204/192.18 |
| 5,075,641 | 12/1991 | Weber et al. | 331/108 C |
| 5,166,646 | 11/1992 | Avanic et al. | 331/107 A |

FOREIGN PATENT DOCUMENTS

| | | |
|---|---|---|
| 0155145 | 9/1985 | European Pat. Off. . |
| 2382073 | 9/1978 | France . |

OTHER PUBLICATIONS

Krummenacher et al., "Smart Temperature Sensor in CMOS Technology", Sensors and Actuators, vol. A22, Mar. 1990, pp. 636–638.

*Primary Examiner*—Do Hyun Yoo
*Attorney, Agent, or Firm*—Richard K. Robinson

[57] ABSTRACT

An electronic device (1) has a substrate (2) of monocrystalline silicon on which is an integrated circuit (3). The integrated circuit is an oscillator containing a resonator, a maintenance circuit to cause the vibration of the resonator, and a frequency division chain. The maintenance circuit as well as the division chain are manufactured as CMOS circuits. The resonator is an integrated resonator (4) formed of a body cut out in a delimited surface part of reduced thickness (14) of the substrate (2), of a thin layer of piezoelectric material (10) deposited on at least a part (6) of the body, and of a thin metallic layer (11) deposited on the piezoelectric layer (10) so as to form an electrode.

6 Claims, 1 Drawing Sheet

ELECTRONIC DEVICE COMPRISING AN INTEGRATED TIME BASE

The present invention concerns an electronic device comprising, at least a completely integrated time base, and more specifically an electronic device integrating into one and the same substrate a time base, comprising an oscillator and a resonator, associated to integrated circuits using CMOS technology and which may be used in a timepiece.

The time base of a timepiece generally comprises an oscillator comprising a quartz resonator and a maintenance circuit which causes the resonator to vibrate so as to supply an oscillation frequency which is more or less stable, a division chain and possibly a frequency adjusting circuit which modifies the division ratio of the division chain. The maintenance circuit, the division chain as well as the adjusting circuit are usually obtained by using CMOS technology and are integrated into a single substrate. On the contrary, the quartz resonator is an external component which must be connected specifically to the integrated circuit, thus requiring a specific assembly operation and extra costs inherent to this operation. The interest of a time base which may be completely integratable into the same substrate as the circuit which uses this time base may thus be readily conceived.

It has already been proposed to realise a purely electronic oscillator using a capacity which is powered by a reference current. An example has been given by, for example, Robert A. Blauschild at the ISSCC conference 1994 with the title "An integrated Time Reference". Such a solution, even if it may be integrated, does however not allow to obtain the conditions as required for horologic applications, i.e. a high precision and a very low consumption.

American patent U.S. Pat. No. 4 890 370 describes a process of structuring a silicon wafer for the manufacturing of an integrated resonator in this wafer. However, this document only mentions, but does not describe, a thin high frequency resonator (several tens of MHz) vibrating according to a thickness mode. Such a resonator would not be appropriate for horologic applications.

An object of the present invention is to provide a solution to the mentioned problems of the prior art by providing an electronic device at least comprising a time base with an integrated resonator.

Another object of the present invention is to present such a device which is of low cost and easy to manufacture.

Another object of the invention is a device comprising, in the same substrate, a time base, its integrated resonator and adjustment means of the frequency as a function of the temperature.

The invention thus has for object an electronic integrated device comprising a monocrystalline silicon substrate, and comprising an integrated circuit comprising an oscillator containing a resonator, a maintenance circuit to cause the resonator to vibrate, and a frequency division chain, said maintenance circuit as well as said division chain being manufactured as CMOS circuits, said device being characterised in that said resonator is an integrated resonator formed of a body cut out in a delimited surface part having a reduced thickness of said substrate, of a thin layer of piezoelectric material deposited on at least a part of said body, and of a thin metallic layer deposited on said piezoelectric layer so as to form an electrode.

Preferably, the integrated resonator is formed of an elongated central part associated to two end parts to form together a bar loaded by two terminating masses. The piezoelectric layer is deposited on the central part. The resonator is attached to the substrate by the intermediate of an arm connected to the center of the bar. This resonator is intended to vibrate according to a length extensional mode, which allows to obtain a high piezoelectric coupling.

This specific structure of the resonator allows for a post-processing of the manufacturing process, i.e. that the manufacturing process of the resonator is compatible with the CMOS manufacturing process of the electronic device according to the invention and only requires a few supplementary steps. The specific form of the resonator and the vibration mode chosen further allow to obtain a high quality factor and its dimensions may be adapted to obtain the desired frequency with a low consumption and using little space.

Advantageously, the device according to the invention allows to provide a very stable frequency by incorporating a temperature measuring integrated circuit for compensating a variation of the frequency of the resonator as a function of the temperature.

Figure 2:
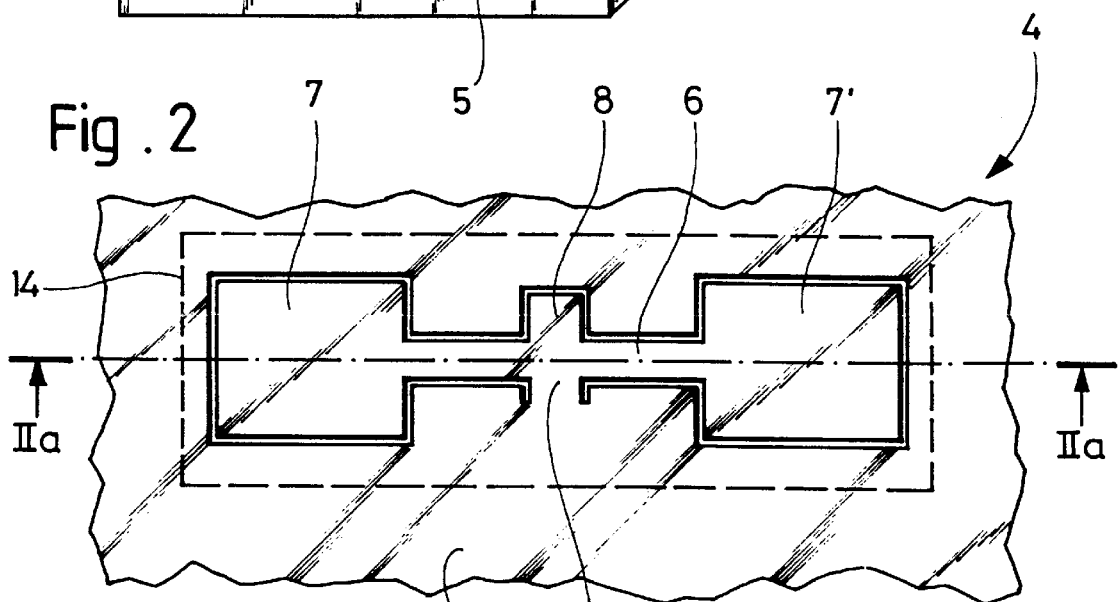
Figure 2A:
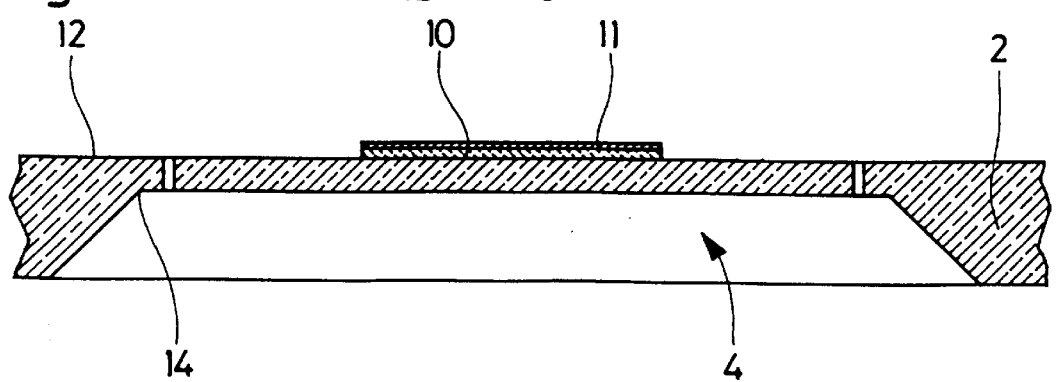

An embodiment of the object of the invention will be described hereafter, by way of an example only, with reference to the attached drawings in which:

FIG. 1 represents schematically an integrated electronic device according to the invention, FIG. 2 shows schematically the shape of an integrated resonator intended to be used in the device according to FIG. 1, and FIG. 2a is a schematic cross-sectional view along the line IIa—IIa FIG. 2 showing the structure of the integrated resonator.

FIG. 1 represents schematically an integrated electronic device 1 according to the invention. Device 1 comprises a substrate 2 of monocrystalline silicon. An integrated circuit 3 is formed in the substrate 2 and comprises a maintenance circuit and a division chain of a time base. Integrated circuit 3 is in fact constituted by the different components of a time base without resonator. Such an integrated circuit is manufactured in the substrate by a CMOS manufacturing process for creating the several components of this integrated circuit 3 in a top surface zone 12 of substrate 2. Such may be obtained in a manner known to the skilled person and will thus not be described in detail here. Time base 3 comprises a maintenance circuit and is arranged to provide an output frequency which is intended to power, for example, a control circuit of the display of a timepiece (not represented).

To this effect, integrated circuit 3 further comprises, in a known manner, a division chain for dividing the frequency provided by the oscillator. Advantageously, an adjustment circuit is provided, for example an inhibition circuit, so as to obtain the exact frequency and have a temperature compensation. Such a circuit is also known to the skilled person and will now be described in detail hereafter. The maintenance circuit is associated to an integrated resonator 4 manufactured in the same substrate 2 as integrated circuit 3.

FIG. 2 shows schematically the shape of integrated resonator 4. Resonator 4 is formed in a thinner part of substrate 2. This thinner part may be obtained by etching of the wafer in a delimited zone 14. The residual thickness of this thinner part will be around 50 micrometers; this value, however, not being critical. Preferably, resonator 4 is formed of a central elongated part in the shape of a bar 6 which is loaded at each of its extremities with terminating masses 7, 7'. These masses 7, 7' are intended to lower the frequency of resonator 4. The bar, or the central portion 6, is connected to substrate 2 by way of a decoupling zone 9. There is further provided a zone 8 which only function is to ensure the global symmetry of the resonator.

With reference to FIG. 2a, it may be seen that resonator 4 comprises a thin layer 10 of piezoelectric material deposited only on central part 6 of resonator 4. A thin metallic layer 11 is deposited on piezoelectric layer 10 for forming an electrode, the second electrode being formed by the silicon-doped body of the resonator. The piezoelectric coupling is determined only by the total surface of the piezoelectric layer, so that the shape of this deposition is not critical.

The choice of a material among the several different piezoelectric materials determines amongst others the consumption of the resonator. The material must further be stable so as not to influence too much the frequency of the oscillator. Furthermore, this material must be able to be deposited on the resonator in a way which is compatible with the classic CMOS manufacturing processes.

The use of aluminium nitride AlN as the piezoelectric material was observed experimentally as being particularly suitable. In fact, although this is a semiconductor material, its electrical resistivity is sufficiently high within the operating temperature range. Furthermore, this material, which is compatible with the classic materials in microelectronics, allows a deposition by a sputtering process at temperatures which are compatible with the CMOS manufacturing processes intended to obtain the device 1 according to the invention.

The geometry of the resonator which has just been described allows to obtain a very good decoupling with respect to substrate 2 and a high quality factor Q. It is noted here that the quality factor is equal to $2\pi$ times the ratio of the internal energy of the resonator (sum of kinetic energy and potential energy) to the energy lost by this resonator during an oscillation cycle. Advantageously, this decoupling may further be optimized by a slight misalignment between the symmetry axis of terminating masses 7, 7' and central part 6 which connects them. An example of the dimensions of a resonator 4 is the following: a length which is around 2.1 mm, a width of around 0.7 mm and a thickness of several tens of micrometers ($10^{-6}$ m).

The functioning of the integrated resonator 4 is the following. By applying an alternating voltage between metallic layer 11 and substrate 2, piezoelectric layer 10 will cause the vibration of central part 6 of resonator 4.

A frequency of $2^{20}$ Hz ($\approx$1.05 MHz) was chosen for the resonator according to the invention. The piezoelectric layer 10 is excited in such a way that the resonator vibrates in a fundamental length extensional mode along the plane. Central part 6 elongates along its plane alternatively towards end part 7 and towards end part 7'.

Also, it has been observed experimentally that the thermal coefficient of such a silicon resonator is around $-30$ ppm/°C. It is thus highly recommended to incorporate, in the same substrate 2, a temperature measuring circuit having an output signal which may be used to compensate for this variation by controlling the frequency adjusting circuit of the time base.

To this effect, electronic device 1 according to the invention advantageously further comprises an integrated temperature measuring circuit 5. Measuring circuit 5 may be formed of vertical bipolar transistors arranged in such a way as to compensate for the variations of the frequency of resonator 4 as a function of the temperature. An example of such a measuring circuit is described in the article "Smart Temperature Sensor in CMOS Technology" by P. Krumenacher and H. Oguey, in "Sensors and Actuators", A 21–A23 (1990), pages 636 to 638.

An example of a manufacturing process of the resonator 4 is given hereafter. The back face of substrate 2 may be etched chemically to define a delimited zone 14 having a reduced thickness. Following this, an etching of the front face may be performed for defining the geometry of resonator 4. After this, a single supplementary mask suffices for depositing and metallising piezoelectric layer 10.

Thanks to its particular structure as well as to its specific shape, the resonator may be easily incorporated in a time base comprising an integrated circuit 3 so as to form an integrated time base, and this resonator is compatible, as far as its consumption is concerned, with the integrated circuit 3 obtained by CMOS technology. Furthermore, this integrated time base comprising such a resonator is more stable and more accurate than known integrated time bases.

Although a preferred embodiment of the device according to the invention has been described hereabove, the invention is not limited to this specific embodiment, which is given solely by way of a non-limited example of the invention.

What we claim is:

1. An integrated electronic device comprising a monocrystalline silicon substrate, and comprising an integrated circuit comprising an oscillator containing a resonator, a maintenance circuit to cause the resonator to vibrate, and a frequency division chain, said maintenance circuit as well as said division chain being manufactured as CMOS circuits, wherein said resonator is an integrated resonator formed of a body cut out in a delimited surface part having a reduced thickness of said substrate, of a thin layer of piezoelectric material deposited on at least a part of said body, and of a thin metallic layer deposited on said piezoelectric layer so as to form an electrode.

2. An electronic device according to claim 1, wherein the device further comprises an integrated temperature measuring circuit intended to compensate for the variation of the frequency of said resonator as a function of the temperature.

3. An electronic device according to claim 1, wherein the integrated resonator comprises a central elongated part associated to two end parts forming together a bar having to extremities and which is loaded at each of said extremities by a terminating mass, and thus forming the integrated resonator, and in that said piezoelectric layer is deposited only on said central part.

4. An electronic device according to claim 3, wherein the device further comprises an integrated temperature measuring circuit intended to compensate for the variation of the frequency of said resonator as a function of the temperature.

5. An electronic device according to claim 1, wherein said thin layer of piezoelectric material is made of aluminum nitride.

6. An electronic device according to claim 5, wherein the device further comprises an integrated temperature measuring circuit intended to compensate for the variation of the frequency of said resonator as a function of the temperature.

* * * * *